United States Patent
Walheim et al.

(10) Patent No.: US 8,881,650 B2
(45) Date of Patent: Nov. 11, 2014

(54) STAMP FOR MICRO CONTACT PRINTING AND METHOD FOR THE PRODUCTION THEREOF

(75) Inventors: Stefan Walheim, Weingarten (DE); Thomas Schimmel, Karlsruhe (DE); Roland Groeger, Bruchsal (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 551 days.

(21) Appl. No.: 12/530,663

(22) PCT Filed: May 17, 2008

(86) PCT No.: PCT/EP2008/003985
§ 371 (c)(1),
(2), (4) Date: Sep. 10, 2009

(87) PCT Pub. No.: WO2008/145268
PCT Pub. Date: Dec. 4, 2008

(65) Prior Publication Data
US 2010/0107907 A1    May 6, 2010

(30) Foreign Application Priority Data
May 26, 2007 (DE) .......................... 10 2007 024 653

(51) Int. Cl.
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)
USPC .......................................................... 101/28

(58) Field of Classification Search
None
See application file for complete search history.

(56) References Cited

U.S. PATENT DOCUMENTS

| | | | |
|---|---|---|---|
| 6,592,991 B1 * | 7/2003 | Wiesner et al. | ............... 428/404 |
| 6,746,825 B2 | 6/2004 | Nealey et al. | |
| 2006/0134556 A1 | 6/2006 | Nealey et al. | |

FOREIGN PATENT DOCUMENTS

| | | |
|---|---|---|
| DE | 19738913 A1 | 3/1999 |
| EP | 1 193 056 A1 | 4/2002 |
| EP | 1 657 070 A1 | 5/2006 |
| WO | WO-2005/072235 A2 | 8/2005 |
| WO | WO-2006/003594 A2 | 1/2006 |
| WO | WO-2006/112815 A2 | 10/2006 |

OTHER PUBLICATIONS

"Nanolithographic templates form diblock copolymer thin films" P. Mansky et al., Appl. Phys. Lett. 68 (18), Apr. 29, 1996.*
International Search Report Issued in PCT Application No. PCT/EP2008/003985, dated May 17, 2008.

(Continued)

*Primary Examiner* — Joshua D Zimmerman
(74) *Attorney, Agent, or Firm* — Venable LLP; Robert Kinberg; Steven J. Schwarz

(57) ABSTRACT

A die for the micro contact printing includes a die body and a die surface that is fixedly connected to the die body. The die surface is divided into at least two different regions. Each of the at least two regions comprises a different material having a different absorption capacity for printing ink. At least one of the at least two regions has a lateral dimension of no more than 1000 nanometers.

9 Claims, 5 Drawing Sheets

(56) References Cited

OTHER PUBLICATIONS

A. Kumar et al., Features of gold having micrometer to centimeter dimensions can be formed through a combination of stamping with an elastomeric stamp and an alkanethiol "ink" followed by chemical etching, Applied Physics Letters, vol. 63, pp. 2002-2004, 1993.

H.-W. Li et al., Nanocontact Printing, A Route to Sub-50-nm-Scale Chemical and Biological Patterning, Langmuir, vol. 19, pp. 1963-1965, 2003.

L. Libioulle et al., Contact-Inking Stamps for Microcontact Printing of Alkanethiols on Gold, Langmuir, vol. 15, pp. 300-304, 1999.

Y. Xia et al., Use of Controlled Reactive Spreading of Liquid Alkanethiol on the Surface of Gold to Modify the Size of Features Produced by Microcontact Printing, Journal of the American Chemical Society, vol. 117, pp. 3274-3275, 1995.

Y. Xia et al., Extending Microcontact Printing as a Microlithographic Technique, Langmuir, vol. 13, pp. 2059-2067, 1997.

* cited by examiner

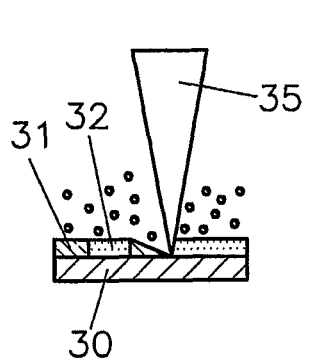
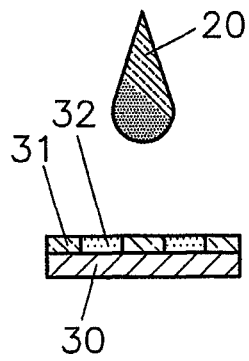
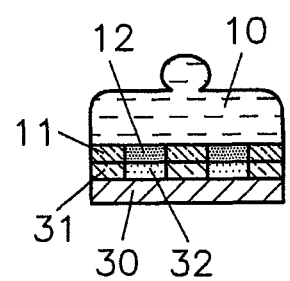
FIG. 3a      FIG. 3b      FIG. 3c
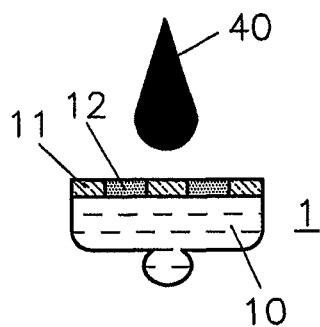
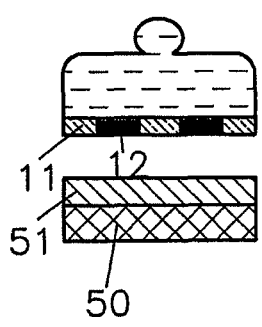
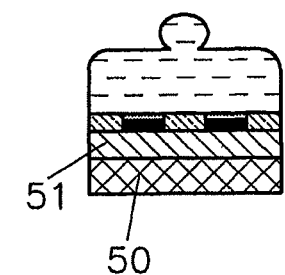
FIG. 3d      FIG. 3e      FIG. 3f
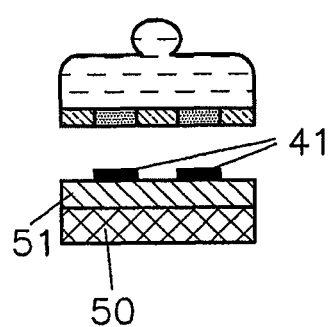
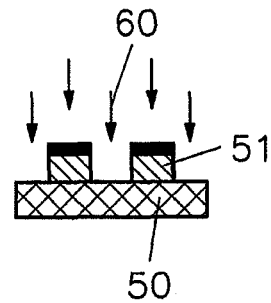
FIG. 3g      FIG. 3h

STAMP FOR MICRO CONTACT PRINTING AND METHOD FOR THE PRODUCTION THEREOF

CROSS-REFERENCE TO RELATED APPLICATION

This application is a National Stage application of International Application No. PCT/EP2008/003985, filed on May 17, 2008 and designating the United States.

BACKGROUND OF THE INVENTION

The invention relates to a stamp, also referred to as a "die" or "die stamp," for the micro contact printing and to a method for the production thereof.

The micro contact printing (Micro Contact Printing, μCP) refers to a method used for producing two-dimensional structures in the sub-micrometer range. According to A. Kumar and G. M. Whitesides, *Features of gold having micrometer to centimeter dimensions can be formed through a combination of stamping with an elastomeric stamp and an alkanethiol "ink" followed by chemical etching*, Applied Physics Letters, Volume 63, pp 2002-2004, 1993, liquid polymer silicon is poured for this over a structured relief, also called a master structure, and is then allowed to harden. The silicon elastomer forms a model of the topography of the mold in order to form a stamp. The stamp is then wetted with functionalized molecules, e.g. self-organizing alkanethiols, which take over the function of the "ink" during the stamping. As a result of direct contact with a substrate, the molecule pattern is transferred from the stamp to the substrate surface, analog to the high-pressure process.

Micro contact printing is simple and cost-effective and can be controlled quite easily for dimensions of the individual structures of approximately 200 nm. Below this dimension, however, the polydimethylsiloxane (PDMS) used for the stamp material reaches its mechanical limits. The resolution that can be achieved is limited by the effect of adhesion and capillary forces during the modeling and stamping. If the relief structures are too narrow, they can be modeled incompletely or can tear off when the stamp is pulled off. Structures with a high aspect ratio can tilt over, can adhere to each other, or can be flattened under pressure during the stamping. With a low aspect ratio, the adhering forces can result in the stamp being pushed through between two structures that are spaced apart too far. In addition, ink molecules can also diffuse through the gas phase onto the surface.

Different approaches have been pursued in recent years for creating structures with dimensions below 100 nm which, however, had to accept restrictions in the layout options for special structures or deal with the introduction of additional and complex process steps.

An attempt was made by H.-W. Li, B. V. O. Muir, G. Fichet, W. T. S. Huck, Nanocontact Printing, *A Route to Sub-50-nm-Scale Chemical and Biological Patterning*, Langmuir, Vol. 19, pp 1963-1965, 2003, to improve the mechanical stability through structures with a triangular cross section. To be sure, smaller lines were obtained in this way, but these had to be placed at greater distance to each other.

To reduce the intermediate spaces between two stamped surfaces, Y. Xia and G. M. Whitesides in *Use of Controlled Reactive Spreading of Liquid Alkanethiol on the Surface of Gold To Modify the Size of Features Produced by Microcontact Printing*, Journal of the American Chemical Society, Vol. 117, pp 3274-3275, 1995, experimented with a controlled spreading of the self-organized molecules during the stamping and in *Extending Microcontact Printing as a Microlithographic Technique*, Langmuir, Vol. 13, pp 2059-2067, 1997, experimented with a mechanical compression of the stamp.

To limit the diffusion of the self-organizing molecules through the gas phase onto the substrate and thus avoid having dull edges along the structures, L. Libioulle, A. Bietsch, H. Schmid, B. Michel, E. Delamarche in *Contact-Inking Stamps for Microcontact Printing of Alkanethiols on Gold*, Langmuir, Vol. 15, pp 300-304, 1999, did not impregnate the stamps, but used only wetted these with molecules on the active stamping surfaces, analog to the use of a stamping pad.

The document EP 1 193 056 A1 discloses a stamp of PDMS for the micro contact printing, which has a temporarily stable, hydrophilic surface that is produced by activating the stamp surface and providing it with a hydrophilic polymer.

The document EP 1 657 070 A1 discloses a stamp of an ionomeric polymer for the micro contact printing, as well as a method for the production of said stamp.

Each of the disclosed methods permits the reduction of a specific pattern characteristic, but does not allow either individually or in a combination the replication of optional patterns with structures having dimensions in the range below approximately 200 nm.

The documents DE 197 38 913 A1, U.S. Pat. No. 6,746,825 B2, and US 2006/0134556 A1, disclose structures on a thin substrate, which are produced through a phase separation of block copolymers. These structures respectively serve as a template, meaning they are sacrificed during one or more additional method steps in a following production process. However, these structures by themselves are not sufficient to reproduce a structure within the framework of a printing process.

SUMMARY

It is an object of the present invention to propose a stamp for the micro contact printing and a method for the production thereof, which do not have the above-mentioned disadvantages and restrictions.

A goal in particular is to make available a stamp without topography for the micro contact printing, which can be used to reproduce nearly optional structures with dimensions of no more than 1000 nm, for example 100 nm, and which makes it possible to overcome all limitations based on the topography of the stamp.

The micro contact printing stamp according to the invention consists of a stamp body and a stamp surface that is fixedly connected to the stamp body, for example cross-linked with it, wherein the stamp surface is composed of at least two different types of material that respectively have a different absorption capacity for printing ink. The at least two different materials are arranged in the at least two regions in such a way that at least one of these regions has a lateral dimension of no more than 1000 nm, for example 100 nm.

The stamp body consists of an elastomer, meaning a material with molecules that can be chemically cross-linked and which are above their glass transition temperature when at room temperature. These materials include in particular polyisoprene (PI), polybutadiene (PB), polydimethylsiloxane (PDMS), natural rubber or thermoplastic elastomers.

The stamp surface comprises two or more different regions, wherein one region of the stamp surface advantageously contains an elastomer. This elastomer can even be the same material as the one used for the stamp body. The other regions of the stamp surface may contain a different elastomer or a glass-type polymer, meaning a polymer with molecules which are below their glass transition temperature when at room temperature.

According to one embodiment, the stamp surface comprises a polymer mixture or a block copolymer, for which the components are selected such that they have respectively different absorption capacities for the printing ink.

For example, the stamp surface may be a block copolymer, which contains as a component polyisoprene, polybutadiene or polydimethylsiloxane, in particular polyethyleneoxide-b-polyisoprene-b-polyethyleneoxide (PEO-PI-PEO) or polystyrene-b-polybutadiene-b-polystyrene (SBS).

Inks suitable for use are the known inks for the micro contact printing. The use of hydrophilic inks is made possible by the presence of hydrophilic regions on the stamp. The stamp therefore need not be hydrophilized separately as is the case with a stamp made of pure PDMS.

In contrast to the prior art, the micro contact printing stamp according to the invention is free of any topography, meaning the reproduction of the stamped-in pattern is not achieved with structures having different heights above the stamp surface, but with a flat surface that is divided into regions having respectively different absorption capacities for the printing ink. The limitations imposed by the standard micro contact printing can thus be overcome because of the fact that the topography is missing almost completely.

Those stamp surfaces which do not absorb ink on the one hand support the stamp, relative to the substrate, while on the other hand they protect the surface against any undesirable diffusion of ink. Problems caused by the mechanical stress on the topographic structures can thus be overcome while, simultaneously, it is possible to realize patterns with very little area to be stamped on.

A micro contact stamp according to the invention can be produced in particular using the following method steps.

According to the method step a), a substrate is initially made available as template for the stamp, wherein one embodiment uses a flat silicon waver.

According to the method step b), the surface of the substrate is then structured such that the surface is divided into at least two regions with different chemical properties. A layer consisting of at least two different polymers or of a block copolymer is deposited onto the structured surface of the substrate, thereby separating the layer into at least two phases, corresponding to the division into at least two regions.

The chemically heterogeneous structuring is advantageously realized with a scanning probe technique, in particular using an atomic force microscope (AMF) with electron-beam, UV, X-ray interference, or imprint lithography. In the process, self-organized molecules or polymer brush-type molecules are removed or replaced in a monolayer.

Alternatively, a thin oxide layer is removed with the aid of a hydrogen fluoride treatment. The patterns created in this way should have as little topography as possible, but should exhibit a strong chemical contrast.

According to one embodiment, the phase separation of phase-separating polymer mixtures or block copolymer layers on the stamp surface is achieved with a self-organizing process, which is controlled by lateral, chemical heterogeneously structured substrates.

The surfaces structured in this way exhibit a strong polarity contrast to ensure an arrangement of the polymer morphology. Suitable for this are self-organizing monolayers such as silanes on oxides, thiols on coin-metal surfaces or the so-called brush-type polymers, meaning short polymer molecules that are bound to the substrate.

In the following method step c), a material is initially deposited from which a stamp body is fashioned. Cross-linkage between the stamp body formed in this way and the deposited layer then results in the forming of a stable stamp, wherein the layer forms the stamp surface that is fixedly connected to the stamp body.

Finally, in the method step d) the stamp body is lifted off the substrate together with the layer functioning as the stamp surface.

According to one embodiment, the phase-separated layer is cross-linked with a polyisoprene stamp body and, according to step d), is then lifted off the remaining substrate together with the stamp. During this process, the original substrate advantageously remains intact and can be reused for producing additional stamps.

A stamp according to the invention can be used with the micro contact printing process. For the printing process, the stamp surface that comprises two materials with different absorption capacities for printing ink is saturated with ink. The molecules from the ink advantageously diffuse into one of the two phases. If the stamp is then pressed onto a background, the molecules from the saturated phase of the layer replicate the previously structured pattern in the form of a self-organizing monolayer on the surface.

In particular, the inventive use of block copolymers and of the atomic force microscope (AFM) creates the preconditions for a nearly optional transfer of involved two-dimensional patterns onto a layer, even patterns with dimensions of no more than 1000 nm.

BRIEF DESCRIPTION OF THE DRAWINGS

The invention is explained in further detail in the following with the aid of exemplary embodiments and the Figures, showing in:

FIGS. 3a-3h are diagrams illustrating the production of a stamp according to an embodiment of the present invention for the micro contact printing and the micro contact printing method;

DETAILED DESCRIPTION

FIG. 1 schematically illustrates the micro contact printing method disclosed in the prior art. Based on a lithographically structured mold 30, which has a relief-type surface and functions as stamp template (FIG. 1a), a silicon stamp 1 is modeled (FIG. 1c) by pouring silicon 10 polydimethylsiloxane (PDMS) into the mold (FIG. 1b).

Figure 1A:
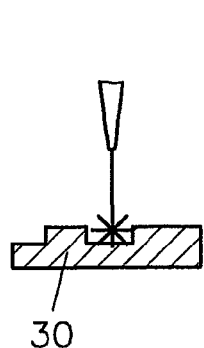
FIGS. 1a-1h are diagrams illustrating a micro contact printing method according to the prior art.
Figure 1B:
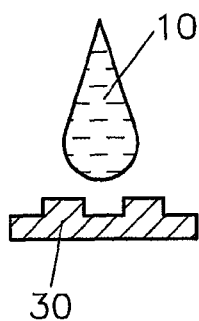
Figure 1C:
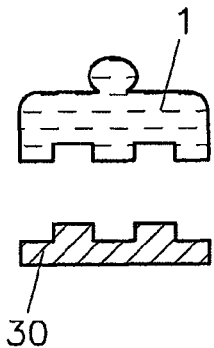
Figure 1D:
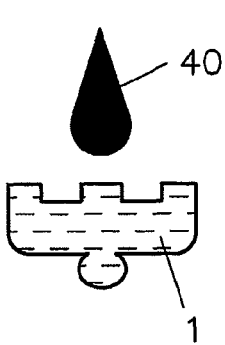
Figure 1E:
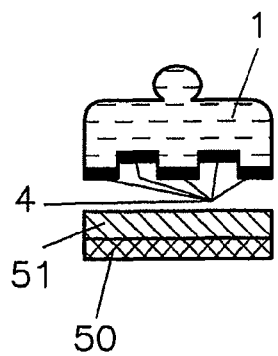
Figure 1F:
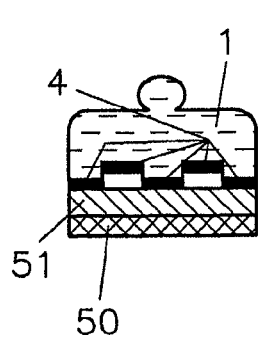
Figure 1G:
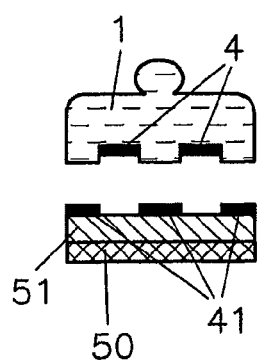
Figure 1H:
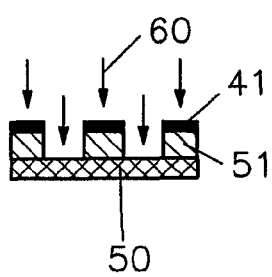

For the printing operation, the stamp 1 is wetted with molecules 40 (FIG. 1d), which penetrate the regions 4 of the relief-type surface of the stamp 1 (FIG. 1e). As a result of direct contact, a self-organized monolayer 41 forms as a pattern on the projecting surfaces of a substrate 51, which can be a metal surface on a carrier 50 (FIG. 10. Once the stamp 1 (FIG. 1*g*) is lifted off, the pattern adhering to the substrate 51 that is formed as self-organized monolayer 41 can, for example, serve as a resist in an etching process 60 for etching the substrate 51 (FIG. 1*h*).

Figure 2A:
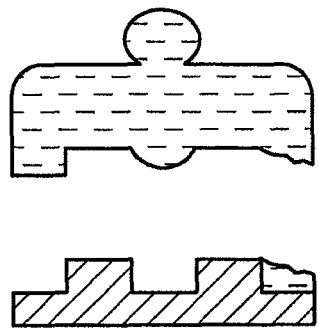
FIGS. 2a-2d are diagrams illustrating problems occurring with the micro contact printing method according to the prior art.
Figure 2B:
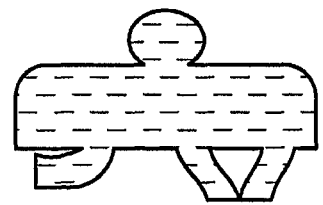
Figure 2C:
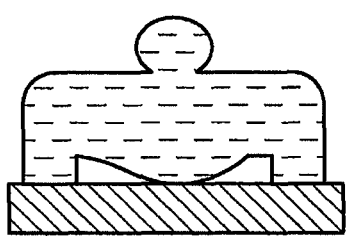
Figure 2D:
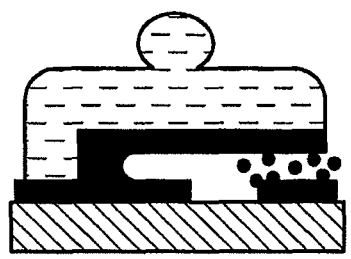

FIG. 2 illustrates the problems of the micro contact printing method at high resolution:

Fine structures are poorly copied or will tear during the pulling apart (FIG. 2*a*);

Extremely small webs on the stamp can tilt over or adhere to each other (FIG. 2*b*);

Large intermediate spaces can be punched through easily during the stamping (FIG. 2*c*);

With a low aspect ratio and as a result of the capillary effect or diffusion on the surface or through the gas phase, the ink is supplied non-specific to the sample and spreads out thereon (FIG. 2*d*).

FIG. 3 schematically illustrates the production of a stamp according to the invention for the micro contact printing, as well as the micro contact printing process realized with this stamp.

1. Preparation of the Substrate

Silicon wafers with naturally oxidized, polished surfaces were used as substrate 30 for the stamp template. The wafers were cut into suitable pieces and cleaned with a carbon dioxide snow jet. By submerging them into pure OTS or into an OTS containing n-hexane solution, the surface was coated with a self-organizing or self-arranging monolayer (SAM) of octadecyltrichlorosilane (OTS).

By cleaving off the chlorine atoms, the silane molecules did bond covalent with the silicon surface and formed a dense monolayer. The layer thickness was 2.4 nm while the chemical functionalizing occurred through the non-polar $CH_3$ end group of the molecule. Following the coating, the samples were again cleaned with a carbon dioxide snow jet. The OTS layer proved to be stable relative to this treatment.

2. Structuring of the Substrate

According to FIG. 3*a*, the monolayer of OTS was structured with the aid of an atomic force microscope into a nanoscale, lateral, heterogeneous chemical structure. With a correct selection of the applied pressure, the tip 35 of the AFM removed the surface-bonded molecules of the monolayer or the brush molecules, without modifying the substrate. This type of action is also referred to as nanoshaving or molecular editing. The structuring was realized with an AFM, either in the dry state in ambient air or inside a liquid cell in a solution.

While removing the molecules for the structuring, the silicon head group of the silane remains on the substrate and only the alkane chain is separated out while the remaining head groups form an additional $SiO_x$ monolayer. The separated out alkane chains on the other hand cannot bond again with the surface. A chemical contrast is thus created in a non-polar environment, for which the edited regions are polar.

The patterns created with this process in the regions 31, 32 can be very complex. In practice, they are delimited only by the dimensions of the region that can be scanned with the structuring microscope and, in the case of larger structures, by the wear of the tip 35 on the AFM. The lines can be spaced apart optionally and optional surfaces can also be structured. The line width itself is predetermined by the radius of the tip 35 on the AFM.

Following the structuring, the sample was again cleaned with a carbon dioxide snow jet.

3. Preparation of the Block Copolymer Film

The polymer used was polyethyleneoxide-b-polyisoprene-b-polyethyleneoxide (PEO-PI-PEO), which is composed of three connected polymer blocks with molar masses of $m_{PEO}$—12.3 kg/mol and $M_{PI}$=43.4 kg/mol. The PEO component is a polar component while the PI component is non-polar.

A drop of the 1% solution 20 of this polymer in toluene was dripped according to FIG. 3*b* onto the sample with the structured regions 31, 32 where the toluene evaporated under ambient conditions. The amount was selected such that it resulted in the creation of an approximately 100 nm thick layer. During the evaporation, the various blocks of the block copolymer were divided into ordered, phase-separated regions 11, 12 because of their repelling interaction. As a result, the blocks arranged themselves on the respective structures of the sample in dependence on the polarity: the polar PEO to the polar regions 31, e.g. consisting of silicon dioxide, and the non-polar PI to the non-polar regions 32, e.g. consisting of $CH_3$-terminated OTS.

To further improve the arrangement following the evaporation, the sample was subjected to toluene vapor for a period of time. This process is referred to as vapor annealing and promotes the diffusion of the polymer molecules in the layer and the relaxation of the system to reach the thermodynamic balance.

Figure 4A:
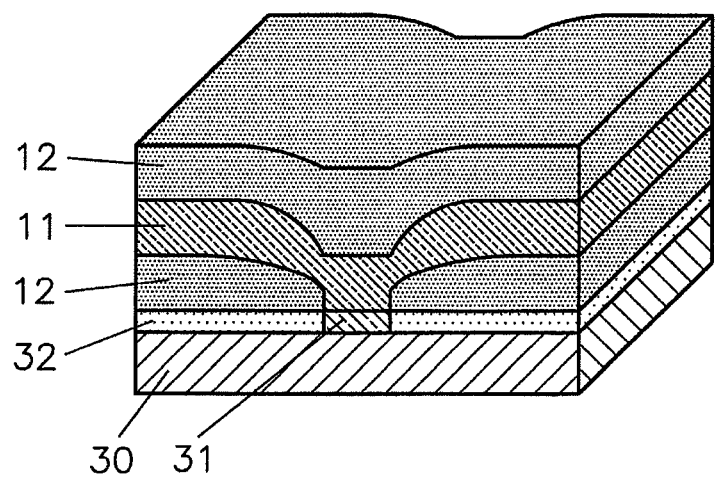
FIGS. 4a-b are diagrams illustrating the lamellar morphology of the PEO-PI-PEO layer on a self-organized monolayer of OTS prior to and after the stamp production according to an embodiment of the present invention.

FIG. 4*a* shows the lamellar morphology of the layer consisting of the phase-separated block copolymer PEO-PI-PEO on a structured template, prior to producing the stamp 1. The PI component of the block copolymer precipitated out on the regions 32 while the PEO lamella adhered to the regions 31.

4. Production of the Stamp

Liquid synthetic polyisoprene was used for the stamp material 10. According to FIG. 3*c*, this material was vulcanized directly onto the substrate 30 which is coated with the polymer layer that is phase-separated into the regions 11, 12, as well as the regions 31, 32.

For this, the liquid polyisoprene was mixed with 10% by weight dicumylperoxide (DCPO), which was subsequently dripped onto the sample and was kept at a temperature of 150° C. for a period of 1 hour inside a crucible under vacuum conditions. In order to temporarily increase the tear resistance of the material for the separation from the substrate, the sample was cooled down for a period of time to −20° C., following the vulcanization.

The cross-linked polyisoprene stamp could subsequently be pulled off without leaving any residues on the structured substrate. The block copolymer layer was also pulled from the sample surface since the PI blocks of the layer were vulcanized onto the stamp. In the process, the original substrate remained intact and could be used for the production of further stamps.

Figure 4B:
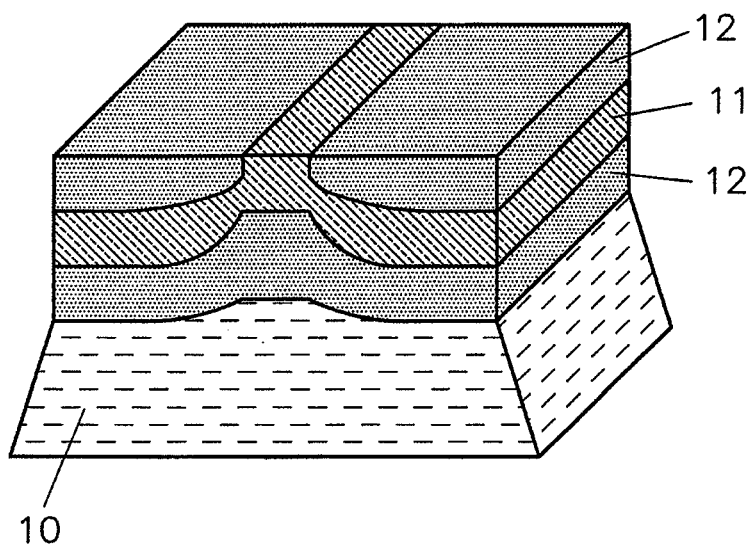

The selected block copolymer has the special property that the orientation of the phase separation is vertical and not lateral. As a result, alternating areas of stamping and screening regions can be created. FIG. 4*b* shows that when producing the stamp with a stamp body of PI, there is no change in the morphology of the block copolymer layer and in the width of the PEO domain along the structured line.

In a different experiment, a stamp body of SBS was deposited onto the phase-separated polymer layer by pouring on a block copolymer polystyrene-b-polybutadiene-b-polystyrene (SBS) dissolved in toluene and allowing the material to dry.

5. Realizing of the Stamping

For the stamping, the phase-separated block copolymer layer 11, 12 on the underside of the stamp 1 is saturated according to FIG. 3*d* with a solution of alkane thiols (ODT). The ODT molecules advantageously diffuse according to FIG. 3*e* into the visco-elastic phase 12. Following this, the stamp according to FIG. 3f is pressed onto a gold layer 51 on a silicon substrate, wherein the ODT molecules from the saturated phase 12 of the layer replicate the previously structured pattern in the form of a self-organized monolayer 41 on the surface of the gold layer 51 (FIG. 3g), which in this case can also function as resist in an etching process 60 for etching the gold layer 51 (FIG. 3h).

Figure 5A:
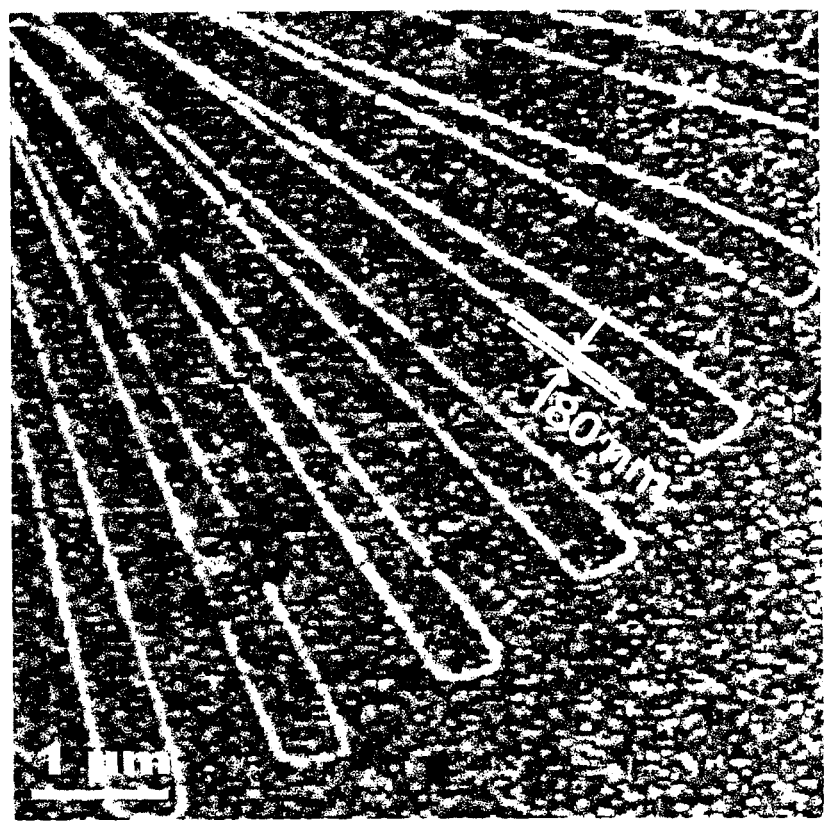
FIG. 5a illustrates a phase contrast image of a wheel structure in the block copolymer layer on the underside of the stamp according to an embodiment of the present invention.

FIG. 5a shows a phase contrast image, recorded with an atomic force microscope (AFM), of a wheel structure in the block copolymer layer on the underside of the stamp. The line width was determined to be 80 nm at various locations.

Figure 5B:
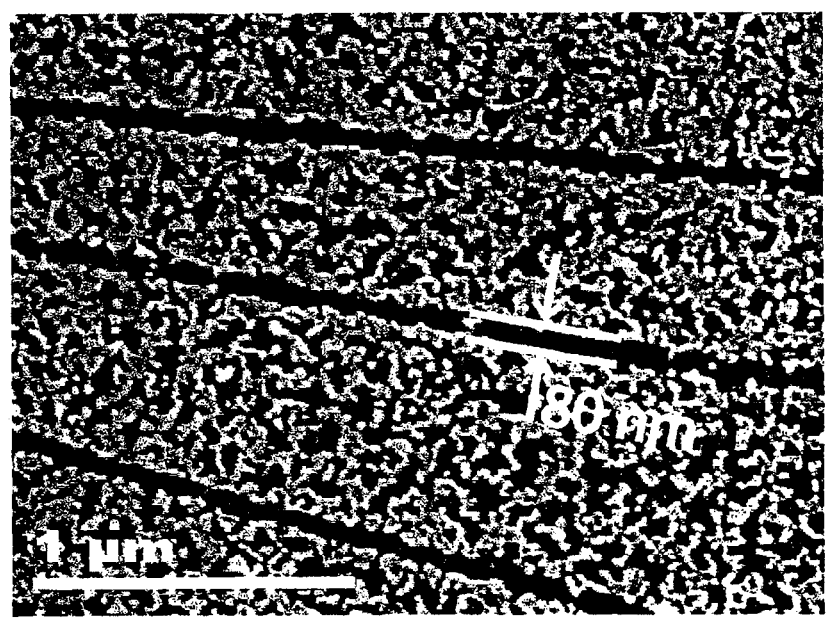
FIG. 5b illustrates a scan electron microscope recording of a gold layer according to an embodiment of the present invention.

FIG. 5b shows a scan electron microscopic recording of a gold layer, which is stamped with the stamp shown in FIG. 5a and is subsequently etched. The lines of the etched gold structure at 80 nm were equally wide as the lines on the stamp.

It will be understood that the above description of the present invention is susceptible to various modifications, changes and adaptations, and that the same are intended to be comprehended within the meaning and range of equivalents of the appended claims.

The invention claimed is:

1. A stamp for micro contact printing, comprising:
   a stamp body of a stamp body material comprising an elastomer; and
   a stamp surface that is fixedly connected to the stamp body, wherein the stamp surface is divided into at least a first region of a first material and a second region of a second material, wherein the first material and the second material have different absorption capacities for printing ink;
   wherein at least one of the first material or the second material is different than the stamp body material, and at least one of the first region and the second region has a lateral dimension of no more than 1000 nanometers;
   further wherein one of the first material or the second material is the same as the stamp body material, and the other of the first material or the second material comprises an elastomer or a polymer.

2. The stamp according to claim 1, wherein at least one of the at least two regions has a lateral dimension of no more than 100 nanometers.

3. The stamp according to claim 1, wherein the first material and the second material comprise a polymer mixture that is separated into ordered phases or a block copolymer.

4. The stamp according to claim 3, wherein the block copolymer comprises one of polyisoprene, polybutadiene or polydimethylsiloxane.

5. A stamp for micro contact printing, comprising:
   a stamp body of a stamp body material; and
   a stamp surface that is fixedly connected to the stamp body, wherein the stamp surface is divided into at least a first region of a first material and a second region of a second material, wherein the first material and the second material comprise a block copolymer, and the first material and second material have different absorption capacities for printing ink;
   wherein at least one of the first material or the second material is different than the stamp body material;
   further wherein the block copolymer includes one of polyethyleneoxide-b-polyisoprene-b-polyethyleneoxide or polystyrene-b-polybutadiene-b-polystyrene.

6. A method for producing a stamp for the micro contact printing according to claim 1, comprising:
   a) providing a substrate as a template for the stamp;
   b) structuring a surface of the substrate to divide into at least two regions with different chemical properties and depositing a layer of one of a block copolymer or of a mixture of at least two different polymers onto the structured surface of the substrate to produce an ordered separation of the layer into at least two phases that correspond to the at least two regions;
   c) depositing a material for forming the stamp body and cross-linking the stamp body with the side of the layer that is facing away from the substrate; and
   d) removing the stamp body and the layer that functions as stamp surface from the substrate.

7. The method according to claim 6, further comprising structuring the surface of the substrate using a scanning probe technique or a lithographic technique prior to step b).

8. The method according to claim 6, further comprising depositing a self-organizing monolayer on the surface of the substrate prior to step b).

9. A stamp for micro contact printing, comprising:
   a stamp body of a stamp body material comprising an elastomer; and
   a stamp surface that is fixedly connected to the stamp body, wherein the stamp surface is divided into at least two different regions, wherein each of the at least two regions comprises a different material having a different absorption capacity for printing ink;
   wherein the material of at least one of the at least two regions is different than the stamp body material, and at least one of the at least two regions has a lateral dimension of no more than 1000 nanometer;
   further wherein one of the first material or the second material is the same as the stamp body material, and the other of the first material or the second material comprises an elastomer or a polymer.

* * * * *